United States Patent
Myeong et al.

(10) Patent No.: US 11,114,629 B2
(45) Date of Patent: *Sep. 7, 2021

(54) FOLDABLE DISPLAY DEVICE

(71) Applicant: Samsung Display Co., Ltd., Yongin-Si (KR)

(72) Inventors: Man Sik Myeong, Seoul (KR); Ah-Ram Lee, Cheonan-si (KR); In Seo Kee, Asan-si (KR); Han Sun Ryou, Seoul (KR); Sung Chul Choi, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/423,319

(22) Filed: May 28, 2019

(65) Prior Publication Data

US 2019/0280226 A1 Sep. 12, 2019

Related U.S. Application Data

(63) Continuation of application No. 15/657,529, filed on Jul. 24, 2017, now Pat. No. 10,347,852.

(30) Foreign Application Priority Data

Nov. 18, 2016 (KR) .................. 10-2016-0153904

(51) Int. Cl.
*H01L 51/00* (2006.01)
*G06F 1/16* (2006.01)
(Continued)

(52) U.S. Cl.
CPC ........ *H01L 51/0097* (2013.01); *G06F 1/1616* (2013.01); *G06F 1/1652* (2013.01);
(Continued)

(58) Field of Classification Search
CPC .... G06F 1/1681; G06F 1/1652; G06F 1/1637; G06F 1/1624; G06F 1/1616;
(Continued)

(56) References Cited

U.S. PATENT DOCUMENTS 7,558,057 B1 7/2009 Naksen et al.
9,173,287 B1 10/2015 Kim et al.
(Continued)

FOREIGN PATENT DOCUMENTS

CN 104395852 A 3/2015
CN 104900149 A 9/2015
(Continued)

*Primary Examiner* — James Wu
*Assistant Examiner* — Christopher L Augustin
(74) *Attorney, Agent, or Firm* — Innovation Counsel LLP

(57) ABSTRACT

A display device for reducing a stress applied to a display panel in a folded state is provided. The display device includes a display panel and a panel support portion. The display panel includes a bendable area. The panel support portion is combined to the display panel and includes a multi-joint member supporting the bendable area. The multi-joint member includes joint portions that are sequentially arranged, and a sliding member passing through the joint portions and moving inside the panel support portion. The sliding member includes a plate portion for arranging the joint portions, and a hook-shaped portion connected to a side of the plate portion and arranging the joint portions in a circular arc shape.

20 Claims, 13 Drawing Sheets

(51) Int. Cl.
    *H04M 1/02*           (2006.01)
    *H01L 27/32*         (2006.01)

(52) U.S. Cl.
    CPC ........ *G06F 1/1681* (2013.01); *H04M 1/0216* (2013.01); *H04M 1/0268* (2013.01); *H01L 27/32* (2013.01); *H01L 27/3241* (2013.01); *H01L 51/0024* (2013.01); *Y02E 10/549* (2013.01)

(58) Field of Classification Search
    CPC .................. H05K 5/0017; H05K 5/0217; H01L 51/0097; H01L 51/0024; H04M 1/0268; H04M 1/0216
    See application file for complete search history.

(56) References Cited

U.S. PATENT DOCUMENTS

| | | | |
|---|---|---|---|
| 9,304,549 B2 | 4/2016 | Siddiqui | |
| 9,395,750 B2 | 7/2016 | Saitoh et al. | |
| 9,572,272 B2 | 2/2017 | Lee | |
| 9,625,947 B2 | 4/2017 | Lee et al. | |
| 9,786,207 B2 | 10/2017 | Kim et al. | |
| 9,801,290 B2 | 10/2017 | Ahn | |
| 9,807,893 B2 | 10/2017 | Li et al. | |
| 9,811,119 B2 | 11/2017 | Seo | |
| 9,823,699 B2 | 11/2017 | Ko et al. | |
| 9,829,924 B2 | 11/2017 | Shin et al. | |
| 9,844,251 B2 | 12/2017 | Lin et al. | |
| 9,857,832 B2 | 1/2018 | Kim et al. | |
| 9,864,409 B2 | 1/2018 | Lee et al. | |
| 9,864,438 B2 | 1/2018 | Seo et al. | |
| 9,891,725 B2 * | 2/2018 | Lindblad | G09F 9/301 |
| 9,908,314 B2 | 3/2018 | Seo et al. | |
| 10,225,936 B2 | 3/2019 | Yang et al. | |
| 10,241,600 B2 | 3/2019 | Nade | |
| 2012/0307423 A1 | 12/2012 | Bohn et al. | |
| 2013/0037228 A1 | 2/2013 | Verschoor et al. | |
| 2016/0070306 A1 | 3/2016 | Shin et al. | |
| 2016/0278493 A1 | 9/2016 | Shibahara et al. | |
| 2016/0299532 A1 | 10/2016 | Gheorghiu et al. | |
| 2017/0006725 A1 | 1/2017 | Ahn et al. | |
| 2017/0142847 A1 * | 5/2017 | Park | H05K 5/0017 |
| 2017/0272559 A1 * | 9/2017 | Cavallaro | G06F 1/1652 |

FOREIGN PATENT DOCUMENTS

| | | |
|---|---|---|
| CN | 105190470 A | 12/2015 |
| CN | 105518766 A | 4/2016 |
| CN | 105549682 A | 5/2016 |
| CN | 105788452 A | 7/2016 |
| CN | 105788457 A | 7/2016 |
| CN | 105799300 A | 7/2016 |
| CN | 106028697 A | 10/2016 |
| KR | 10-2014-0026547 A | 3/2014 |
| KR | 10-2015-0092773 A | 8/2015 |
| KR | 10-2016-0009726 A | 1/2016 |
| KR | 10-2016-0017843 A | 2/2016 |
| KR | 10-2016-0056445 A | 5/2016 |
| WO | 2012/167204 A2 | 12/2012 |
| WO | 2015-182662 A1 | 12/2015 |

* cited by examiner

FOLDABLE DISPLAY DEVICE

RELATED APPLICATIONS

This application is a continuation application of U.S. patent application Ser. No. 15/657,529 filed on Jul. 24, 2017, which claims priority under 35 USC § 119 to Korean Patent Application No. 10-2016-0153904 filed in the Korean Intellectual Property Office on Nov. 18, 2016, the entire contents of which are incorporated herein by reference.

BACKGROUND

1. Field

The present disclosure relates to a display device. More particularly, the present disclosure relates to a foldable display device.

2. Description of the Related Art

A flexible display panel is a display panel having a plurality of pixels on a flexible substrate such as a plastic film, and it is easily bendable. Recently, foldable display devices using the flexible display panel have been under research and development. The foldable display device includes a panel support portion for supporting a flexible display panel. The panel support portion is configured to be changeable between a folded state and an unfolded state.

Part of the flexible display panel is bent while it is folded, and a bending degree must be less than a threshold value determined in consideration of a characteristic of a material that is weak in deformation from among a plurality of materials configuring the flexible display panel, for example, an inorganic material. The lifespan of the foldable display device may be guaranteed to be longer when the stress applied to the flexible display panel is reduced while the foldable display device is folded.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a display device for minimizing a stress provided to a flexible display panel while the display device is folded.

The display device includes a display panel and a panel support portion. The display panel includes a bendable area. The panel support portion is combined to the display panel and includes a multi-joint member supporting the bendable area. The multi-joint member includes joint portions that are sequentially arranged, and a sliding member passing through the joint portions and moving inside the panel support portion. The sliding member includes a plate portion for arranging the joint portions, and a hook-shaped portion connected to a side of the plate portion and arranging the joint portions in a circular arc shape.

The joint portions may respectively include a support side facing the bendable area, a pair of first slanted sides connected to respective edges of the support side, and an opening through which the sliding member passes through the joint portions and formed to connect the pair of first slanted sides.

The support side may include a center support side, and two chamfered sides provided on respective sides of the center support side.

The panel support portion may further include a first support plate and a second support plate. The first support plate is disposed on a first side of the joint portions, and includes a first receiving portion for receiving the hook-shaped portion. The second support plate is disposed on a second side of the joint portions, and includes a second receiving portion for receiving the plate portion.

In an unfolded state, the hook-shaped portion may be provided on the first receiving portion, part of the plate portion may pass through the joint portions, and a remaining part of the plate portion may be provided on the second receiving portion. In the folded state, the hook-shaped portion may pass through the joint portions, and the entire plate portion may be provided on the second receiving portion.

The first support plate, the joint portions, and the second support plate may be sequentially arranged in a first direction while in the unfolded state. The panel support portion may further include a plurality of protrusions provided on respective outsides of the display panel in a second direction traversing the first direction.

The protrusions may include a first protrusion protruding from opposing ends of the first support plate, a second protrusion protruding from opposing ends of the joint portions, and a third protrusion protruding from opposing ends of the second support plate. The second protrusion may include a vertical side, and a second slanted side connected to a bottom end of the vertical side. The second slanted side has a same slope as the first slanted side, and is provided on a same plane as the first slanted side.

The joint portions may respectively rotate with respect to a border of the vertical side and the second slanted side as the sliding member moves.

The display panel may include a first side on which a display unit is provided, and a second side provided opposite the first side and facing the panel support portion. The border of the vertical side and the second slanted side may be disposed away from the support side in a direction away from the display panel.

In the unfolded state, the support sides may be separated from each other in the first direction, and may be parallel to an upper side of the first support plate facing the display panel and an upper side of the second support plate facing the display panel.

In the folded state, the support sides may contact each other, and an edge of an outermost support side from among the support sides may be disposed close to a curvature center of the bendable area from the upper side of the first support plate and the upper side of the second support plate.

In the folded state, the support sides may be disposed close to a curvature center of the bendable area than a virtual circular arc connecting the upper side of the first support plate and the upper side of the second support plate.

The first support plate may be combined to the second support plate by a rotation combiner, and the second support plate may rotate and slide with respect to the first support plate when folding and unfolding the display device.

The rotation combiner may include: a rotation shaft rotatably connected to the first support plate; and a guide plate extending toward the second support plate from the rotation shaft. A guide slit may be provided on a side of the second support plate and receives the guide plate.

A display device according to another exemplary embodiment includes a display panel and a panel support portion.

The panel support portion includes a first support plate, a multi-joint member, and a second support plate. The panel support portion supports the display panel. The multi-joint member includes joint portions that are sequentially arranged between the first support plate and the second support plate, and a sliding member passing through the joint portions and movable through insides of the first support plate and the second support plate. The joint portions are separated from each other in the unfolded state, and are disposed inside a virtual circular arc connecting a side of the first support plate facing the display panel and a side of the second support plate facing the display panel in the folded state.

The joint portions may be sequentially arranged in a first direction in the unfolded state, and the joint portions may respectively include a support side facing the display panel, a pair of first slanted sides connected to respective edges of the support side, and an opening through which the sliding member passes through the joint portions and formed to connect the pair of first slanted sides.

The support side may include a center support side, and two chamfered sides provided on respective sides of the center support side.

The multi-joint member may further include a pair of second protrusions. The pair of second protrusions protrude from opposing ends of the support side in a second direction traversing the first direction to cover side surfaces of the display panel.

The pair of second protrusions may include a vertical side, and a second slanted side connected to a bottom end of the vertical side. The second slanted side may be provided on a same plane as the first slanted side. The joint portions may respectively rotate with respect to a border of the vertical side and the second slanted side as the sliding member moves.

The sliding member may include: a plate portion passing through the joint portions in the unfolded state; and a hook-shaped portion connected to a side of the plate portion and passing through the joint portions in the folded state.

According to the exemplary embodiments, in the folded state, a plurality of joint portions are pushed and provided toward the curvature center of the bendable area, thereby minimizing the stress applied to the display panel and easing the tension of the display panel. Therefore, the display device may reduce a damage possibility of the display panel to increase the durability and lifespan of the product.

DETAILED DESCRIPTION

Figure 1:
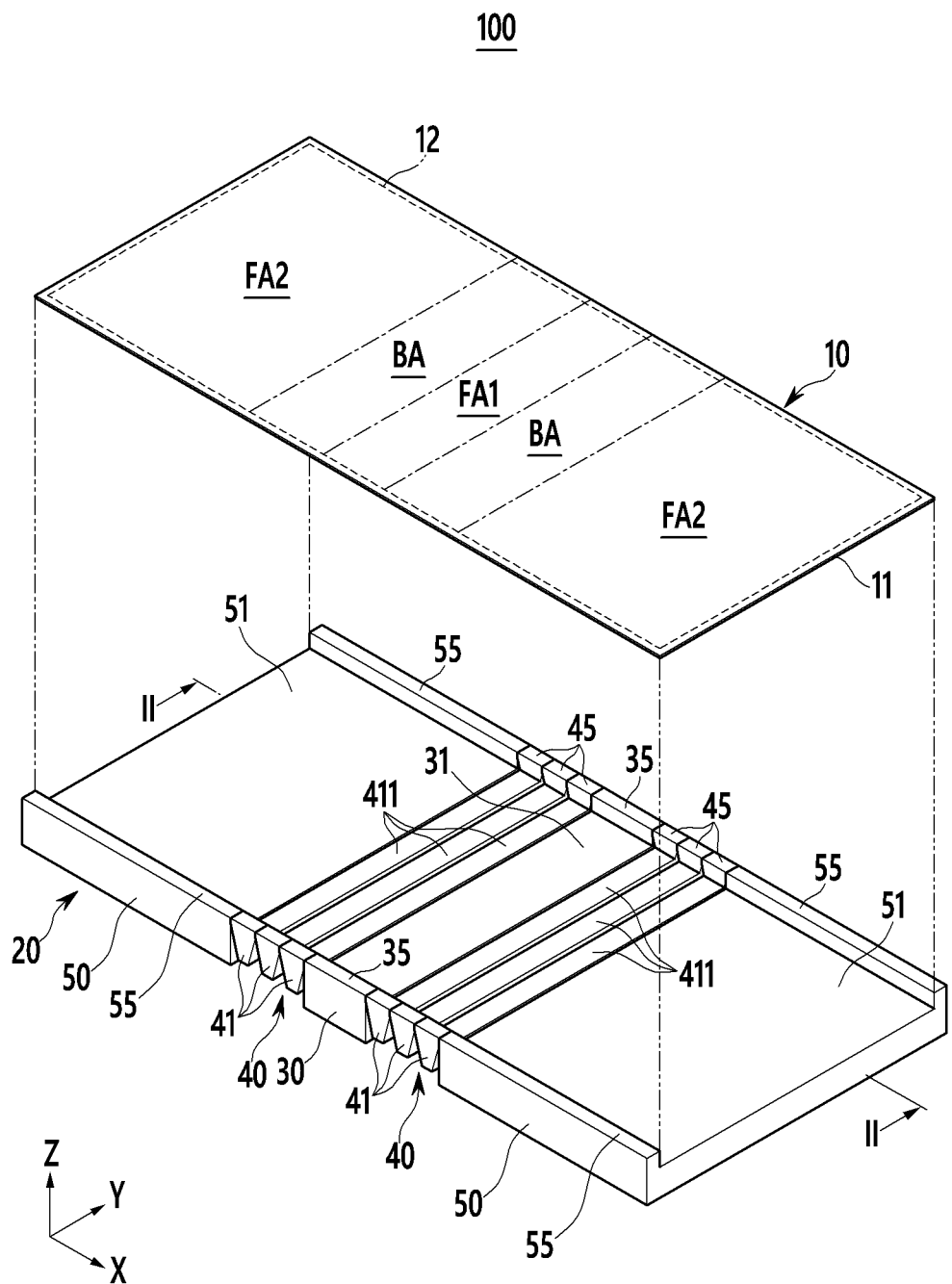
FIG. 1 shows an exploded perspective view of an unfolded state of a display device according to a first exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification.

The size and thickness of each configuration shown in the drawings are arbitrarily shown for better understanding and ease of description, and the present disclosure is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 2:
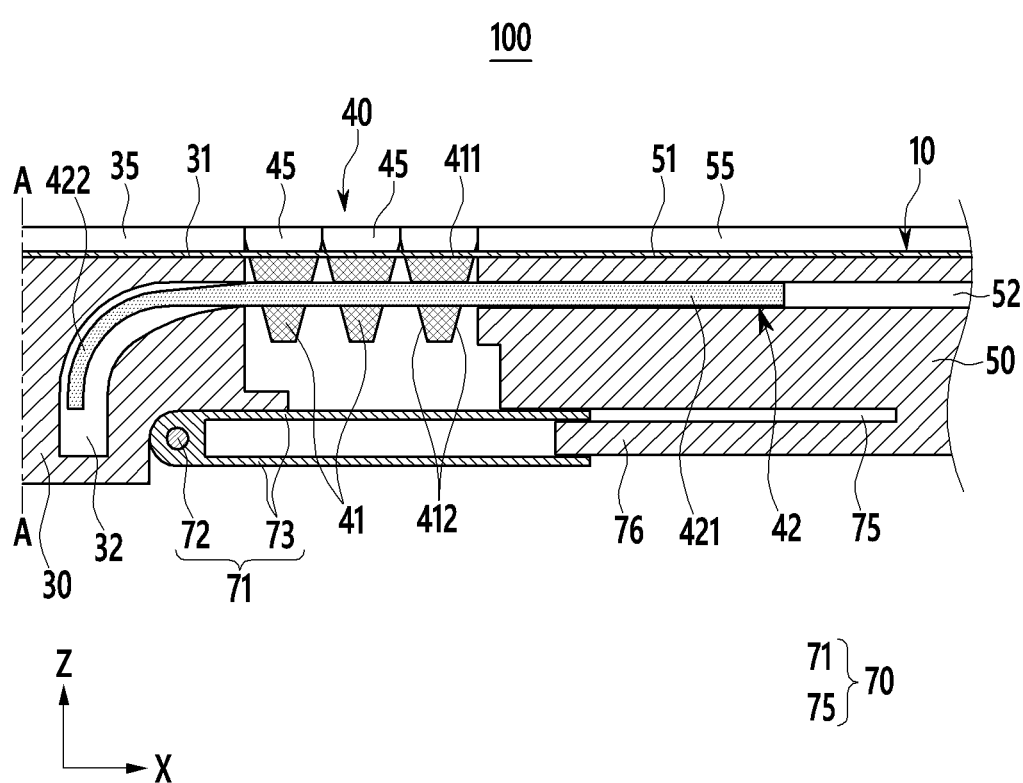
FIG. 2 shows a partial cross-sectional view of a combined state of a display device with respect to a line II-II of FIG. 1.

FIG. 1 shows an exploded perspective view of an unfolded state of a display device according to a first exemplary embodiment and FIG. 2 shows a partial cross-sectional view of a combined state of a display device with respect to a line II-II of FIG. 1.

Referring to FIG. 1 and FIG. 2, the display device 100 according to a first exemplary embodiment includes a display panel 10, and a panel support portion 20 combined to the display panel 10 and supporting the display panel 10. In FIG. 2, the display device 100 is symmetric with respect to a line A-A.

The display panel 10 includes a flexible substrate 11 and a display unit 12 provided on the flexible substrate 11. The flexible substrate 11 may include a plastic film, and the display unit 12 may include a plurality of pixels and a plurality of driving circuits. The display panel 10 may be one of an organic light emitting panel, a liquid crystal panel, and an electrophoretic display panel, and it is not limited thereto.

The display panel 10 includes a flat area (FA) and a bendable area (BA). For example, the display panel 10 includes a first flat area FA1, two bendable areas (BA) provided on respective sides of the first flat area FA1, and two second flat areas FA2 provided on the respective sides of the two bendable areas (BA).

The panel support portion 20 may include a first support plate 30 corresponding to the first flat area FA1, two multi-joint members 40 corresponding to the two bendable areas (BA), and two second support plates 50 corresponding to the two second flat areas FA2. The two multi-joint members 40 respectively include a plurality of joint portions 41 sequentially arranged in a first direction (i.e., an X direction).

The first flat area FA1 of the display panel 10 may be fixed to the first support plate 30 by an adhesive layer and the second flat area FA2 may be fixed to the second support plate 50 by an adhesive layer. However, the bendable area (BA) is not fixed to the multi-joint member 40. In an unfolded state, the bendable area (BA) may contact with a plurality of joint portions 41 or may not contact with the plurality of joint portions 41. The bendable area (BA) and the plurality of joint portions 41 may have a gap between them.

A plurality of joint portions 41 may respectively have a bar shape extending in a second direction (i.e., a Y direction) crossing the first direction (X direction), and may have a trapezoidal shape. The multi-joint member 40 includes a sliding member 42. The sliding member 42 passes through a plurality of joint portions 41 in the first direction (i.e., the X direction) to integrally combine a plurality of joint portions 41.

In the conventional display device, a plurality of joint portions are generally combined to each other by a hinge, but in the display device according to the present exemplary embodiment, a plurality of joint portions 41 are combined to each other by the sliding member 42 and are also combined to the first support plate 30 and the second support plate 50.

Figure 3:
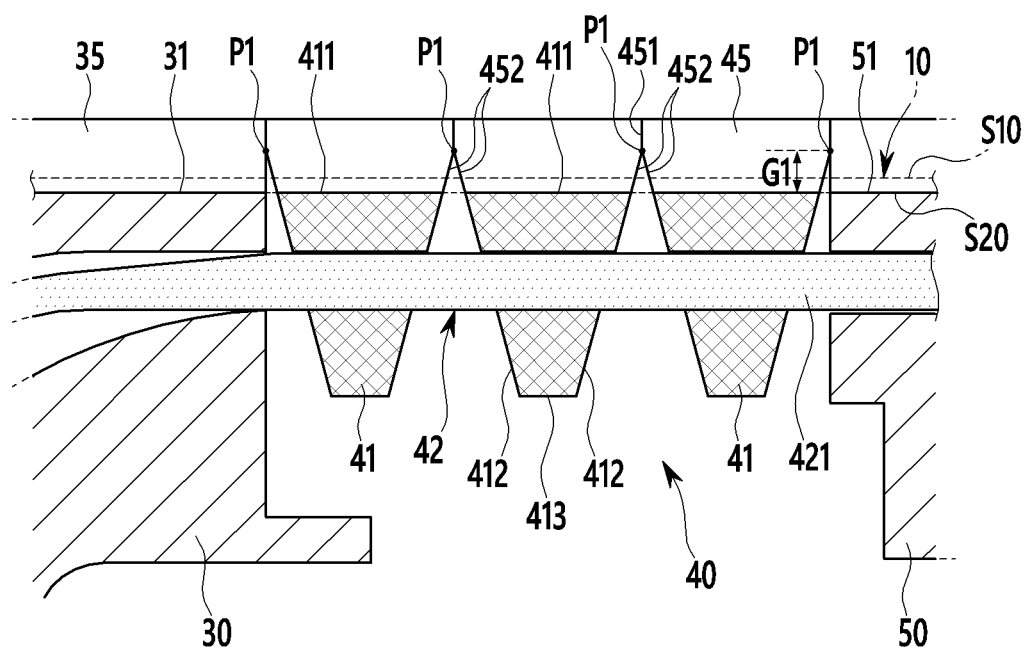
FIG. 3 shows a partial enlarged view of a display device shown in FIG. 2.

FIG. 3 shows a partial enlarged view of a display device shown in FIG. 2.

Referring to FIG. 1 to FIG. 3, the joint portion 41 may include a support side 411 provided toward the bendable area (BA), two first slanted sides 412 connected to respective edges of the support side 411, and a bottom side 413 provided opposite the support side 411. The bottom side 413 is shorter than the support side 411.

The panel support portion 20 may include a plurality of protrusions provided on respective outsides of the display panel 10 in the second direction (i.e., the Y direction). A plurality of protrusions may include first protrusions 35 provided on respective ends of the first support plate 30, second protrusions 45 provided on respective ends of a plurality of joint portions 41, and third protrusions 55 provided on respective ends of the second support plate 50.

The first protrusion 35 protrudes from an edge of an upper side 31 of the first support plate 30 in a positive (+) third direction (i.e., a Z direction). The third protrusion 55 protrudes from an edge of an upper side 51 of the second support plate 50 in the positive (+) third direction (i.e., the Z direction). Respective sides of the first protrusion 35 and respective sides of the third protrusion 55 may be parallel to the third direction (i.e., the Z direction).

The second protrusion 45 protrudes from an edge of the support side 411 of the joint portion 41 in the positive (+) third direction (i.e., the Z direction). Respective sides of the second protrusion 45 may include a vertical side 451, and a second slanted side 452 connected to a bottom end of the vertical side 451. The second slanted side 452 has a same slope as the first slanted side 412, and is provided on a same plane as the first slanted side 412.

In the unfolded state, the vertical side 451 contacts the vertical side 451 of a neighboring second protrusion 45, a side of the first protrusion 35, or a side of the third protrusion 55. The second slanted side 452 is separated from a second slanted side 452 of the neighboring second protrusion 45, a side of the first protrusion 35, or a side of the third protrusion 55. A plurality of support sides 411 are separated from each other in the first direction (i.e., the X direction), and are separated from the upper side 31 of the first support plate 30 which faces the display panel 10, and the upper side 51 of the second support plate 50 which faces the display panel 10.

Figure 4:
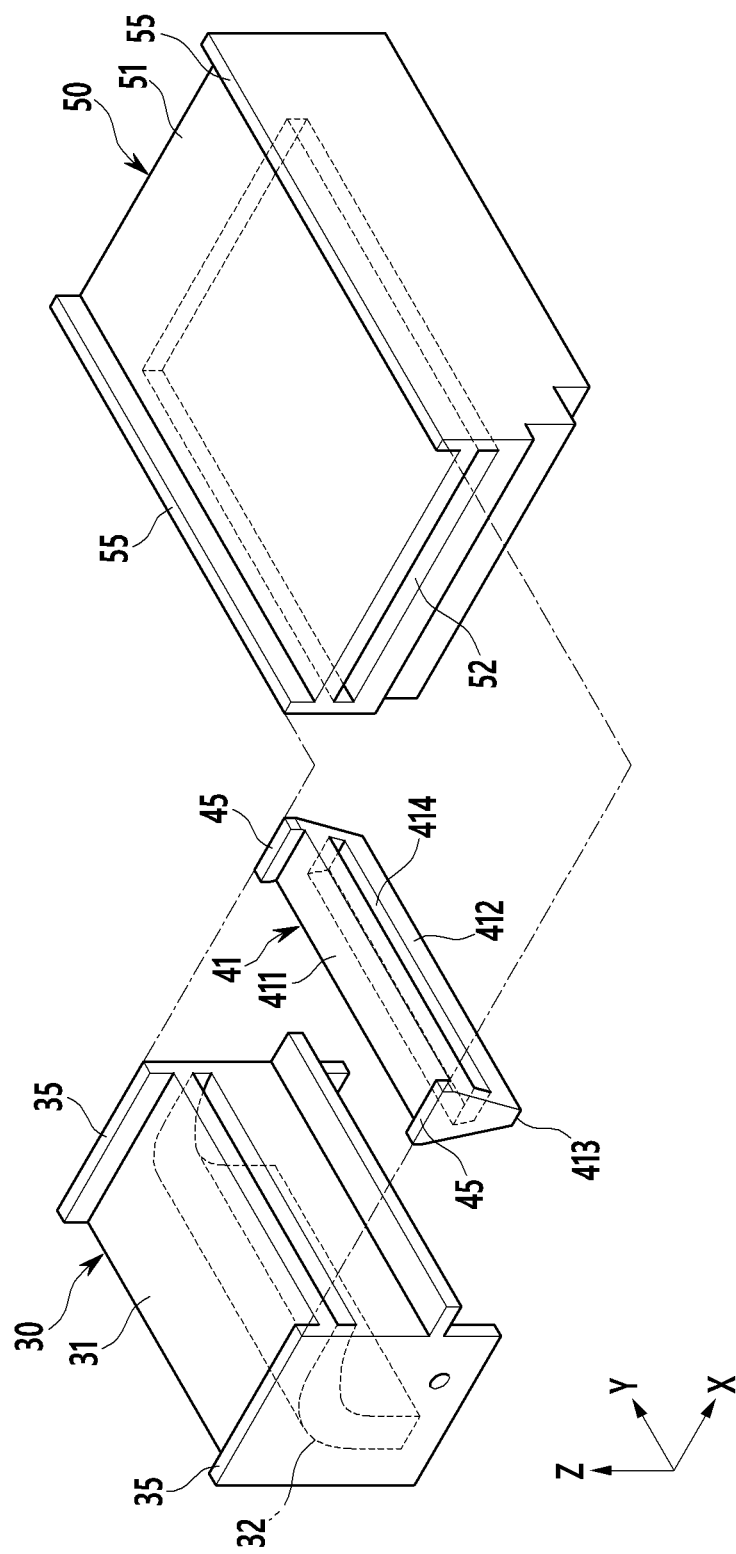
FIG. 4 shows a partial exploded perspective view of a panel support portion of a display device shown in FIG. 1.

FIG. 4 shows a partial exploded perspective view of a panel support portion of a display device shown in FIG. 1. For ease of illustration, FIG. 4 shows one joint portion.

Referring to FIG. 2 to FIG. 4, a plurality of joint portions 41 respectively include an opening 414 passing through the plurality of joint portions 41 from one of the pair of first slanted side 412 to another pair of first slanted side 412. The opening 414 is separated from the support side 411 and the bottom side 413, and is also separated from the respective ends of the joint portion 41 in the second direction (i.e., the Y direction). A plurality of openings 414 formed in the plurality of joint portions 41 are parallel to one another along the first direction (i.e., the X direction).

The first support plate 30 includes a first receiving portion 32 extending inward from one side of the first support plate 30 that is provided adjacent to the joint portion 41.

The first receiving portion 32 may be an internal space of the first support plate 30 for receiving the sliding member 42, and it has a substantially circular arc shape having a central angle of 90° in a cross-section view.

The second support plate 50 includes a second receiving portion 52 extending inward from one side that is provided toward the joint portion 41. The second receiving portion 52 indicates an internal space of the second support plate 50 for receiving the sliding member 42, and has a predetermined height, width and length.

Figure 5:
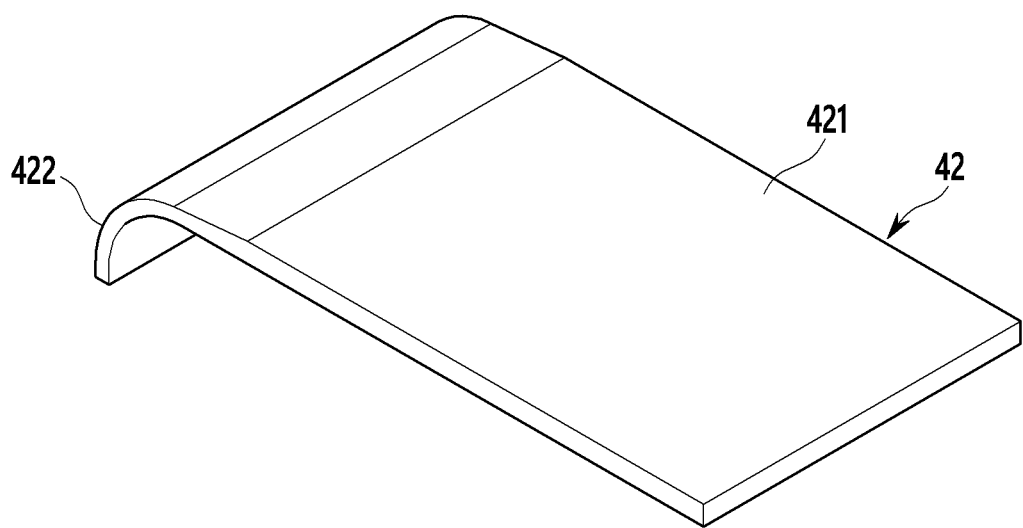
FIG. 5 shows a perspective view of a sliding member of a display device shown in FIG. 2.

FIG. 5 shows a perspective view of a sliding member of a display device shown in FIG. 2.

Referring to FIG. 2 and FIG. 5, the sliding member 42 includes a plate portion 421, and a hook-shaped portion 422 provided on one side of the plate portion 421 and having a circular arc shape. The sliding member 42 slides inside the panel support portion 20 when folding and unfolding the display device 100. The sliding member 42 may be formed of a metal or high-strength plastic.

In the unfolded state, the plate portion 421 is provided on a portion of a second receiving portion 52 provided on the second support plate 50, and a plurality of openings 414 provided in a plurality of joint portions 41. The hook-shaped portion 422 is provided on the first receiving portion 32 formed on the first support plate 30. The sliding member 42 arranges a plurality of joint portions 41 in the first direction (i.e., the X direction), and combines the first support plate 30, the multi-joint member 40, and the second support plate 50.

Figure 6:
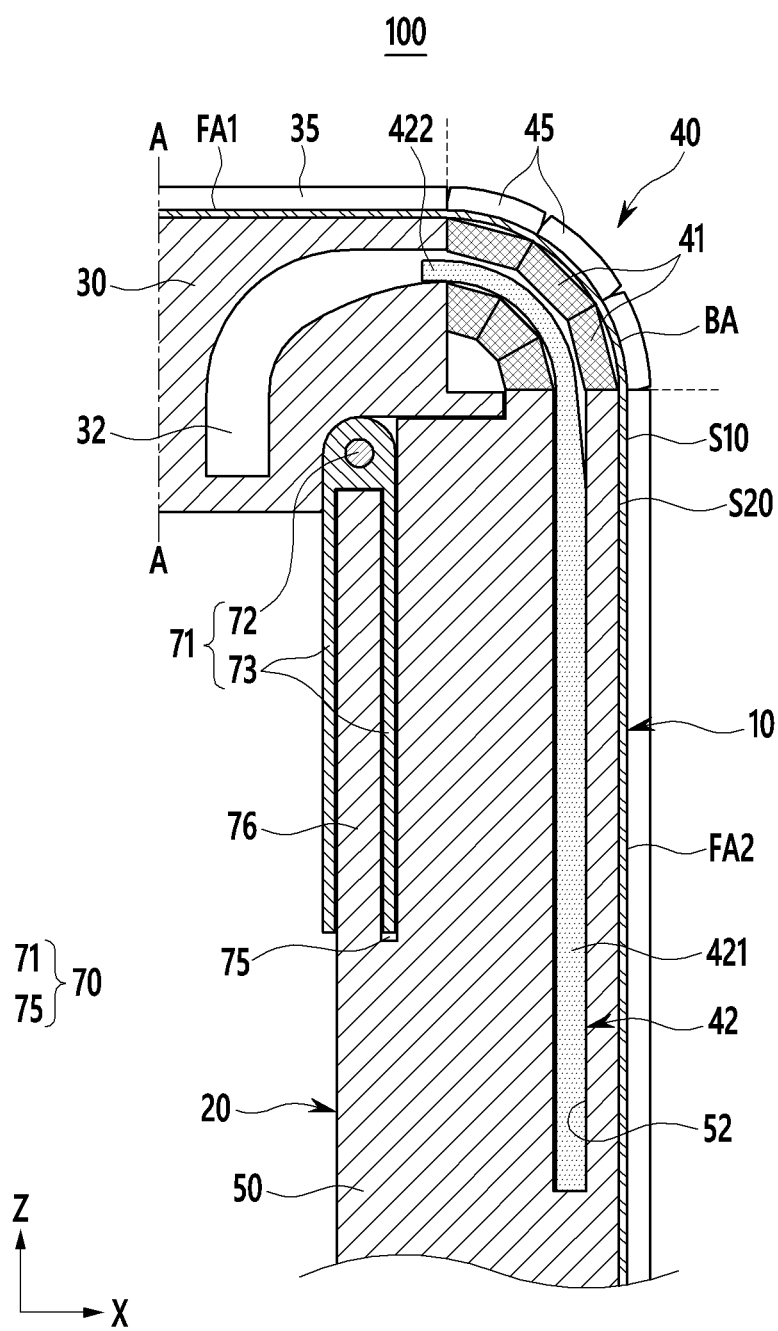
FIG. 6 shows a cross-sectional view of a display device shown in FIG. 2, in a folded state.
Figure 7:
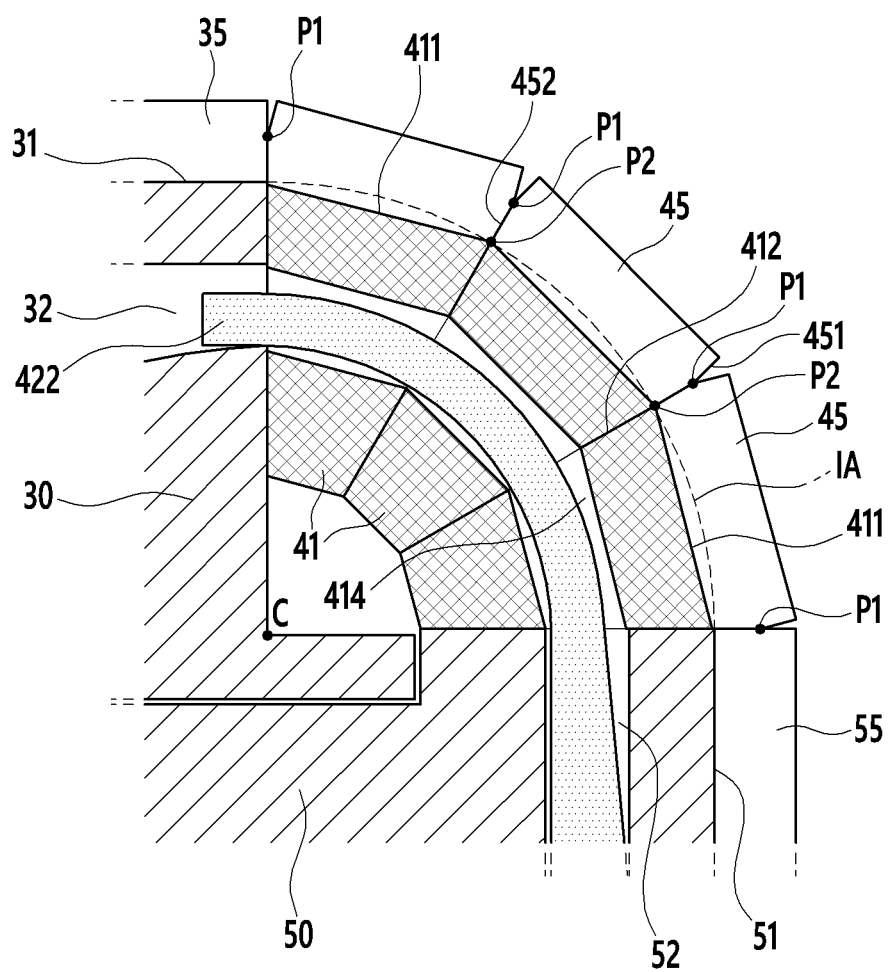
FIG. 7 shows a partial enlarged view of FIG. 6.

FIG. 6 shows a cross-sectional view of a display device shown in FIG. 2, in a folded state, and FIG. 7 shows a partial enlarged view of FIG. 6. In FIG. 6, the display device is symmetric with respect to a line A-A.

Referring to FIG. 6 and FIG. 7, regarding the display device 100, two second support plates 50 are bent by 90° from the first support plate 30, and a plurality of joint portions 41 are changed into the folded state when the first slanted sides 412 and the second slanted sides 452 adjacent to each other contact closely. In this process, the plate portion 421 of the sliding member 42 slides in a direction away from the first support plate 30.

In the folded state, the plate portion 421 is provided on the second receiving portion 52 formed on the second support plate 50. The hook-shaped portion 422 is disposed in a plurality of openings 414 formed in a plurality of joint portions 41, and in a portion of the first receiving portion 32 formed on the first support plate 30. A plurality of joint portions 41 are arranged in a circular arc shape along the hook-shaped portion 422 when the hook-shaped portion 422 instead of the plate portion 421 passes through a plurality of joint portions 41.

When folding and unfolding the display device 100, the sliding member 42 moves inside the panel support portion 20 and changes its position in the unfolded state and the folded state. A plurality of joint portions 41 are arranged in parallel in the first direction (the X direction of FIG. 2) by the plate portion 421 in the unfolded state, and they are arranged in a circular arc shape along the hook-shaped portion 422 in the folded state.

In the folded state, a plurality of support sides 411 adjacent to each other contact each other to correspond to the circular arc that is bent by 90°. The first slanted side 412 of each joint portion 41 contacts the first slanted side 412 of the neighboring joint portion 41, the side of the first support plate 30, or the side of the second support plate 50. The second slanted side 452 of the second protrusion 45 contacts the second slanted side 452 of the neighboring second protrusion 45, a side of the first protrusion 35, or a side of the third protrusion 55.

On the contrary, the vertical side 451 of the second protrusion 45 is separated from the vertical side 451 of the neighboring second protrusion 45, a side of the first protrusion 35, or a side of the third protrusion 55. That is, the vertical side 451 of the second protrusion 45 is separated with respect to the first point P1 which is a border of the vertical side 451 and the second slanted side 452.

Referring to FIG. 3 and FIG. 7, the first point P1 that is a border of the vertical side 451 and the second slanted side 452 on the second protrusion 45 substantially functions as a rotation axis on the multi-joint member 40. In other words, the multi-joint member 40 shows the same operation as the case in which a rotation axis is installed at the first point P1.

The display panel 10 includes a first side S10 on which the display unit 12 is provided and a second side S20 provided opposite the first side S10. The first side S10 is a display side, and the second side S20 may be a display side or a non-display side. The panel support portion 20 faces the second side S20.

The first point P1 is disposed away from the support side 411 in a direction away from the display panel 10 (i.e., in the positive (+) third direction (i.e., the Z direction)) in the unfolded state. A gap G1 (refer to FIG. 3) between the support side 411 and the first point P1 may be greater than the thickness of the display panel 10.

Figure 8:
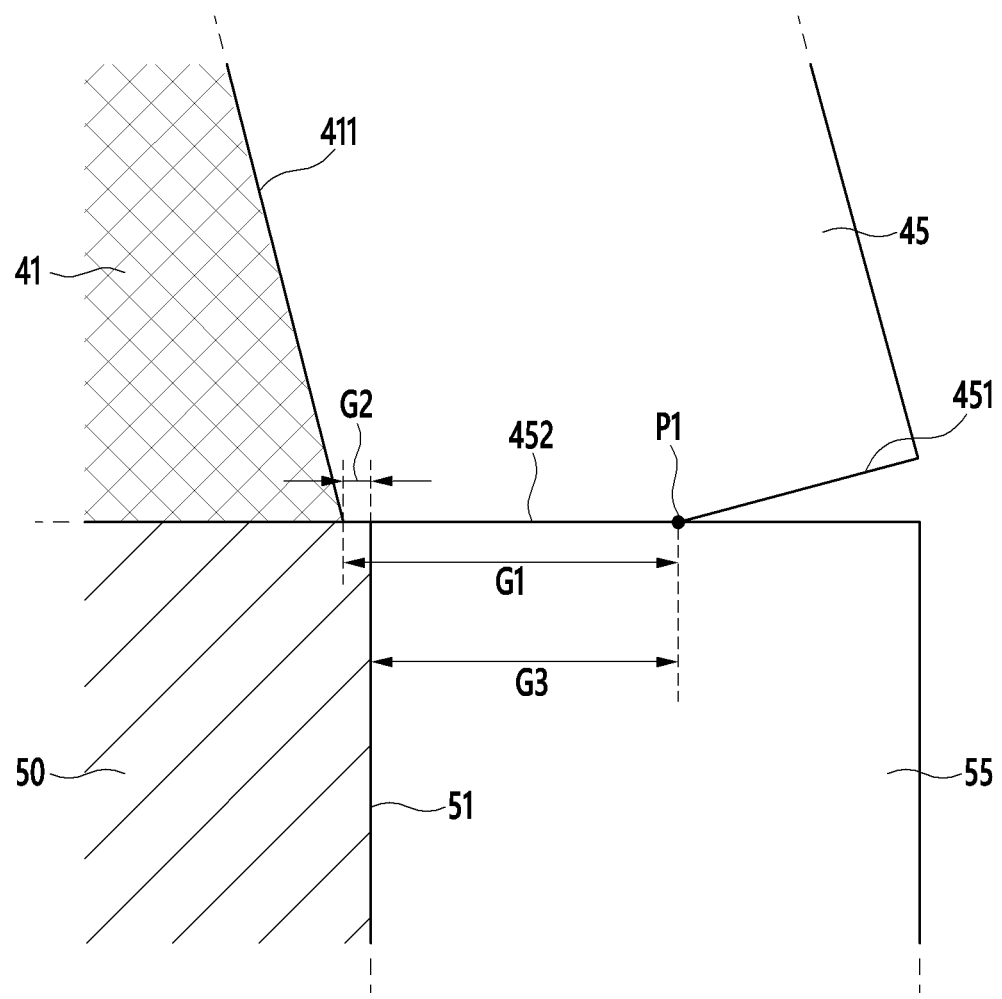
FIG. 8 shows a partial enlarged view of a display device shown in FIG. 7.

FIG. 8 shows a partial enlarged view of a display device shown in FIG. 7.

Referring to FIG. 6 to FIG. 8, as the first point P1 has the gap G1 from the support side 411 of the joint portion 41, in the folded state, an edge of the support side 411 of the outermost joint portion 41 has a predetermined gap G2 toward the curvature center (C) of the bendable area (BA) from the upper side 31 of the first support plate 30 and the upper side 51 of the second support plate 50.

On the first point P1 of the outermost joint portion 41 neighboring the second support plate 50, the gap G1 between the first point P1 and the support side 411 is greater than the gap G3 between the first point P1 and the upper side 51 of the second support plate 50. The difference between the gaps G1 and G3 is provided as the gap G2 in the folded state.

In the unfolded state, a plurality of support sides 411 are separated from each other. This signifies that a sum of lengths of a plurality of support sides 411 is shorter, in the unfolded state, than a length of a virtual line connecting the upper side 31 of the first support plate 30 and the upper side 51 of the second support plate 50. Therefore, in the folded state, a plurality of support sides 411 contacting each other may be provided inside a virtual circular arc (IA) connecting the upper side 31 of the first support plate 30 and the upper side 51 of the second support plate 50.

For example, at least one of a plurality of second points P2 contacting two neighboring support sides 411 may be provided on the virtual circular arc (IA), and the rest of the support side 411 except the edge may be provided inside the virtual circular arc (IA) with a gap from the virtual circular arc (IA). In the folded state, the second side S20 of the bendable area (BA) may be provided on the virtual circular arc (IA).

As described, in the folded state, a plurality of joint portions 41 are pushed to the inside (in a direction toward the curvature center (C) of the bendable area (BA)) from the second side S20 of the bendable area (BA) by the height difference between the support side 411 and the first point P1. Therefore, in the folded state, a plurality of joint portions 41 may minimize the deformation of the display panel 10 to minimize the stress applied to the display panel 10.

Figure 9:
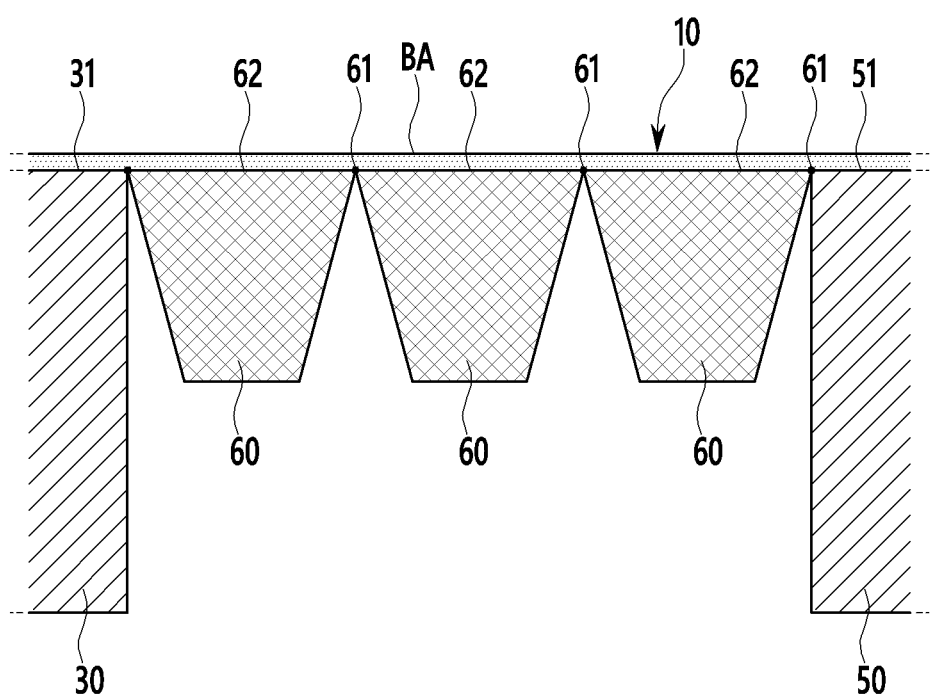
FIG. 9 shows a partial cross-sectional view of a display device in an unfolded state according to a comparative example.
Figure 10:
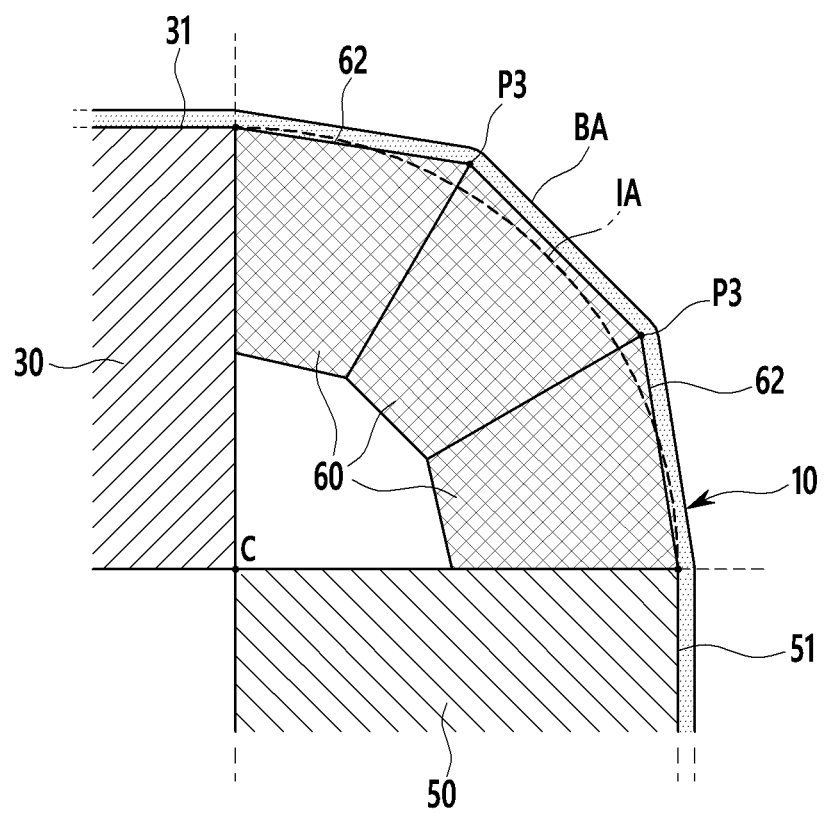
FIG. 10 shows a partial cross-sectional view of a display device shown in FIG. 9, in a folded state.

FIG. 9 shows a partial cross-sectional view of a display device in an unfolded state according to a comparative example, and FIG. 10 shows a partial cross-sectional view of a display device shown in FIG. 9, in a folded state.

Referring to FIG. 9 and FIG. 10, regarding the display device according to a comparative example, a plurality of joint portions 60 are combined to each other by a hinge combiner (not shown) having a hinge axis 61, and a plurality of joint portions 60 may rotate with respect to two hinge axis 61. In the unfolded state, the two hinge axis 61 are provided at the same height as the support side 62 facing the display panel 10.

In the case of a comparative example, in the folded state, a plurality of third points P3 on which a plurality of support sides 62 are connected to each other are provided outside the virtual circular arc (IA) connecting the upper side 31 of the first support plate 30 and the upper side 51 of the second support plate 50. Therefore, a plurality of joint portions 60 push the bendable area (BA) of the display panel 10 in an external direction (a direction away from the curvature center (C)) on a plurality of third points P3, thus, a deformation of the display panel is occurred.

The bendable area (BA) of the display panel 10 is partly bent at a portion contacting a plurality of third points P3, and the stress substantially increases at the portion. The above-noted bent transformation increases a probability of damaging a layer in the display panel 10 that is sensitive to a deformation.

For example, the display panel 10 is configured with multilayers including a flexible substrate, a display unit, an encapsulation layer, a touch sensor, a polarization film, and a cover window. In this instance, a hard coating layer of the cover window or an inorganic insulating layer of the display unit has a brittle property, and it may be easily damaged by the deformation. Therefore, regarding the display device according to the comparative example, in the folded state, a specific layer of the display panel may be damaged by a dramatic increase of stress.

On the contrary, regarding the display device 100 according to the present exemplary embodiment, a plurality of joint portions 41 are pushed toward the curvature center (C) of the bendable area (BA) in the folded state, thereby minimizing the stress applied to the display panel 10 in the folded state. Therefore, the display device 100 according to the present exemplary embodiment may reduce a possibility of damaging the display panel 10 and may increase the durability and the lifespan of the product.

Referring to FIG. 2 and FIG. 6, the first support plate 30 may be combined to the second support plate 50 by a rotation combiner 70. The rotation combiner 70 may include a rotation member 71 installed to be rotated on one side of the first support plate 30 provided toward the second support plate 50, and a guide slit 75 provided on one side of the second support plate 50 provided toward the first support plate 30.

Figure 11:
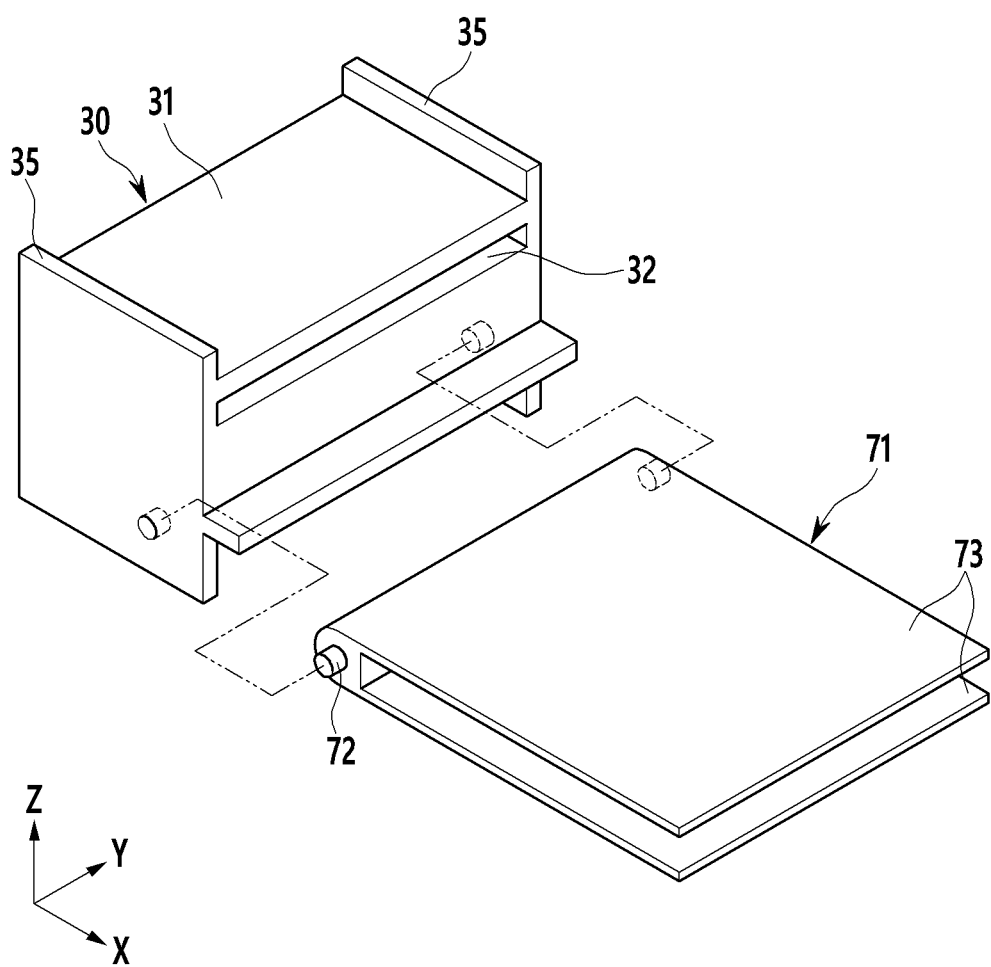
FIG. 11 shows an exploded perspective view of a first support plate and a rotation member of a display device shown in FIG. 2.

FIG. 11 shows an exploded perspective view of a first support plate and a rotation member of a display device shown in FIG. 2.

Referring to FIG. 2, FIG. 6, and FIG. 11, the rotation member 71 may include a rotation shaft 72, and a pair of guide plates 73 combined to the rotation shaft 72 and extending to the second support plate 50 from the rotation shaft 72. The rotation shaft 72 is parallel to the second direction (the Y direction), and includes respective ends combined to the first support plate 30 in a rotatable manner. The pair of guide plates 73 are separated from each other with a predetermined gap therebetween, and in the unfolded state, the rotation member 71 is provided below the multi-joint member 40.

The guide slit 75 may be a space extending toward the inside of the second support plate 50 from one side of the second support plate 50 which is adjacent to the first support plate 30, and it is parallel to the first direction (the X direction) in the unfolded state. One of the pair of guide plates 73 is inserted into the guide slit 75, and another thereof contacts a bottom side of the second support plate 50. In FIG. 2 and FIG. 6, reference numeral 76 is a slider distinguished from a main body of the second support plate 50 by the guide slit 75.

The second support plate 50 is parallel to the first support plate 30 in the unfolded state, and it rotates by 90° from the first support plate 30 with respect to the rotation shaft 72 and it is changed to the folded state. When changed to the folded state, the second support plate 50 slides toward the first support plate 30. That is, when the rotation member 71 rotates, the slider 76 moves toward the rotation shaft 72 between a pair of guide plates 73. In the folded state, the slider 76 may be provided between a pair of guide plates 73.

The panel support portion 20 including the rotation combiner 70 may perform more stable operations when folding and unfolding the display device 100.

Figure 12:
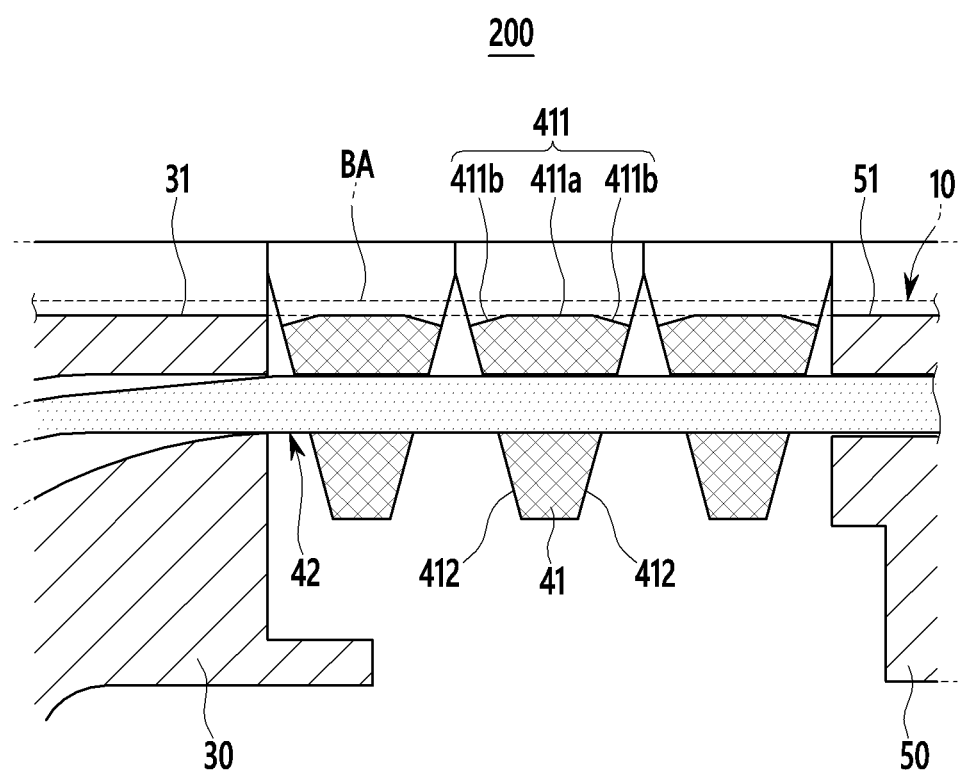
FIG. 12 shows a partial enlarged cross-sectional view of a display device in an unfolded state according to a second exemplary embodiment.
Figure 12:
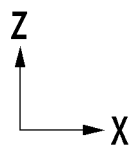
Figure 13:
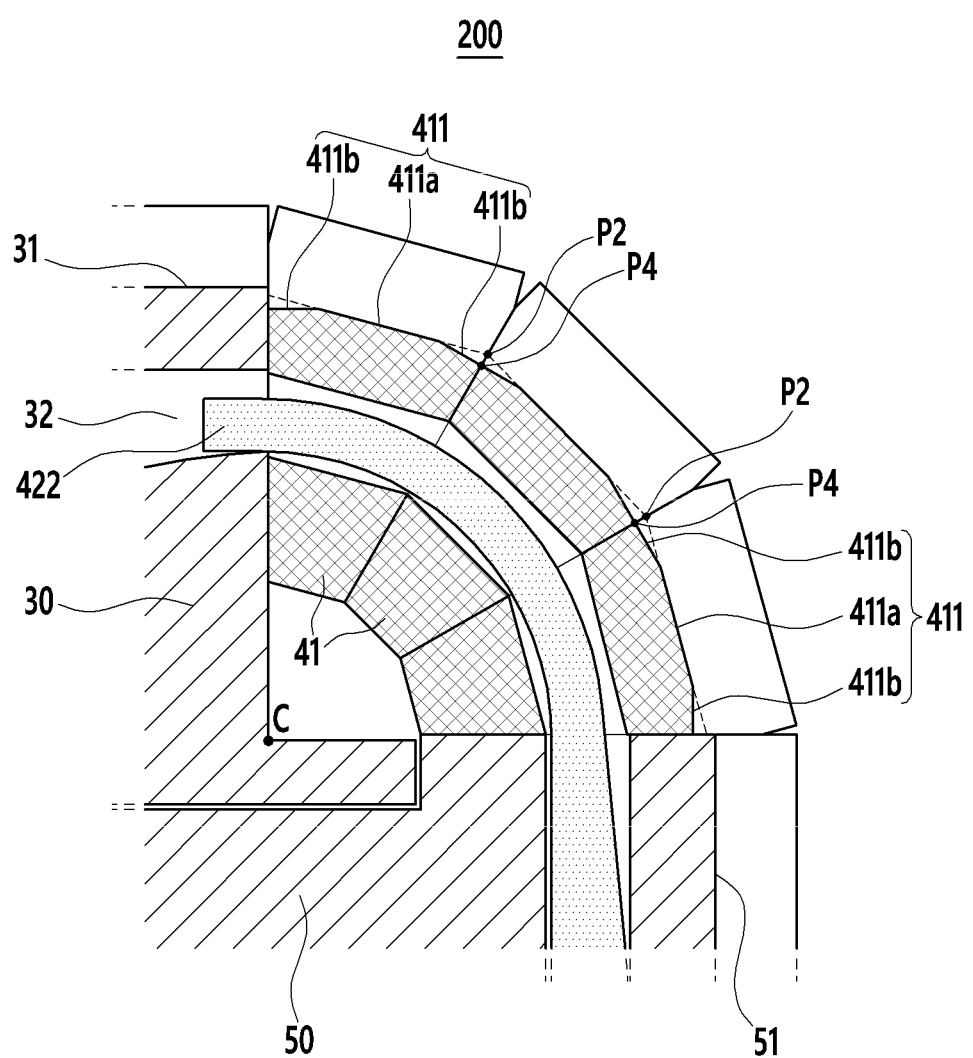
FIG. 13 shows a partial enlarged cross-sectional view of a display device in a folded state according to a second exemplary embodiment.

FIG. 12 shows a partial enlarged cross-sectional view of a display device in an unfolded state according to a second exemplary embodiment, and FIG. 13 shows a partial enlarged cross-sectional view of a display device in a folded state according to a second exemplary embodiment.

Referring to FIG. 12 and FIG. 13, regarding the display device 200 according to a second exemplary embodiment, a plurality of support sides 411 respectively include two chamfered sides 411b. In detail, the support sides 411 may respectively include a center side 411a in parallel to the first direction (the X direction) in the unfolded state, and two chamfered sides 411b provided on respective sides of the center side 411a.

The two chamfered sides 411b are respectively provided between the center side 411a and the first slanted side 412. Widths of the two chamfered sides 411b may be equal to each other, and chamfered angles of the two chamfered sides 411b may be the same. In this case, a plurality of support sides 411 are respectively symmetrical.

A plurality of support sides 411 respectively include two chamfered sides 411b so a plurality of points where two neighboring support sides 411 contact in the folded state are provided nearer the curvature center (C) of the bendable area (BA) than in the above-described first exemplary embodiment.

In the case of a first exemplary embodiment, in the folded state, two neighboring support sides contact each other on the second point P2. However, in the case of a second exemplary embodiment, in the folded state, the two neighboring support sides 411 contact each other on a fourth point P4 (refer to FIG. 13). The fourth point P4 is disposed close to the curvature center (C) of the bendable area (BA) than the second point P2.

The display device 200 according to a second exemplary embodiment may separate the support side 411 of the joint portion 41 from the display panel 10 by a gap between the second point P2 and the fourth point P4. Therefore, a plurality of joint portions 41 do not substantially deform the display panel 10 in the folded state, and may minimize generation of the stress on the display panel 10.

The display device 200 according to a second exemplary embodiment is configured to be like or similar to the above-described first exemplary embodiment except that the support side 411 of the joint portion 41 includes two chamfered sides 411b.

While this disclosure has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a display panel including a flat area and a bendable area; and
   a supporter supporting the display panel and including a multi-joint member,
   wherein the multi-joint member includes joint portions that are sequentially arranged and a sliding member passing through the joint portions and moving inside the supporter, the sliding member including a plate portion and a hook-shaped portion which are formed in one piece, and
   wherein a shape of the sliding member in an unfolded state is the same as a shape of the sliding member in a folded state.

2. The display device of claim 1, wherein the joint portions respectively include a support side facing the bendable area, a pair of first slanted sides connected to respective edges of the support side, and an opening through which the sliding member passes through the joint portions and formed to connect the pair of first slanted sides.

3. The display device of claim 2, wherein the support side includes a center support side, and two chamfered sides provided on respective sides of the center support side.

4. The display device of claim 2, wherein the supporter further comprises:
- a first support plate disposed on a first side of the joint portions and including a first receiving portion for receiving the hook-shaped portion; and
- a second support plate disposed on a second side of the joint portions and including a second receiving portion for receiving the plate portion.

5. The display device of claim 4, wherein, in the unfolded state, the hook-shaped portion is provided on the first receiving portion, part of the plate portion passes through the joint portions, and a remaining part of the plate portion is provided on the second receiving portion.

6. The display device of claim 4, wherein, in the folded state, the hook-shaped portion passes through the joint portions, and the entire plate portion is provided on the second receiving portion.

7. The display device of claim 4, wherein the first support plate, the joint portions, and the second support plate are sequentially arranged in a first direction while in the unfolded state, and
- wherein the supporter further includes a plurality of protrusions protruding from opposing ends of the supporter to cover side surfaces of the display panel.

8. The display device of claim 7, wherein the protrusions include a first protrusion protruding from opposing ends of the first support plate, a second protrusion protruding from opposing ends of the joint portions, and a third protrusion protruding from opposing ends of the second support plate.

9. The display device of claim 8, wherein the second protrusion include a vertical side, and a second slanted side connected to a bottom end of the vertical side, and
- wherein the second slanted side has a same slope as the first slanted side and is provided on a same plane as the first slanted side.

10. The display device of claim 9, wherein the joint portions respectively rotate with respect to a border of the vertical side and the second slanted side as the sliding member moves.

11. The display device of claim 10, wherein the display panel includes a first side on which a display unit is provided, and a second side provided opposite the first side and facing the supporter, and the border of the vertical side and the second slanted side is disposed away from the support side in a direction away from the display panel.

12. The display device of claim 10, wherein, in the unfolded state, the support sides are separated from each other in the first direction and are parallel to an upper side of the first support plate facing the display panel and an upper side of the second support plate facing the display panel.

13. The display device of claim 12, wherein, in the folded state, the support sides contact each other and an edge of an outermost support side from among the support sides is disposed close to a curvature center of the bendable area from the upper side of the first support plate and the upper side of the second support plate.

14. The display device of claim 12, wherein, in the folded state, the support sides are disposed close to a curvature center of the bendable area than a virtual circular arc connecting the upper side of the first support plate and the upper side of the second support plate.

15. The display device of claim 4, wherein the first support plate is combined to the second support plate by a rotation combiner, and
- wherein the second support plate rotates and slides with respect to the first support plate when folding and unfolding the display device.

16. The display device of claim 15, wherein the rotation combiner includes:
- a rotation shaft rotatably connected to the first support plate; and
- a guide plate extending toward the second support plate from the rotation shaft; and
- wherein a guide slit is provided on a side of the second support plate and receives the guide plate.

17. A foldable display device comprising:
- a display panel; and
- a supporter including a first support plate, a multi joint member, and a second support plate, the supporter supporting the display panel,
- wherein the multi-joint member includes joint portions that are arranged between the first support plate and the second support plate, and a sliding member passing through the joint portions and movable through insides of the first support plate and the second support plate, the sliding member including a plate portion and a hook-shaped portion which are formed in one piece, and
- wherein a shape of the sliding member in an unfolded state is the same as a shape of the sliding member in a folded state.

18. The foldable display device of claim 17, wherein the joint portions are sequentially arranged in a first direction in the unfolded state, and
- wherein the joint portions respectively include a support side facing the display panel, a pair of first slanted sides connected to respective edges of the support side, and an opening through which the sliding member passes through the joint portions and formed to connect the pair of first slanted sides.

19. The foldable display device of claim 18, wherein the support side includes a center support side, and two chamfered sides provided on respective sides of the center support side.

20. The foldable display device of claim 18, wherein the multi-joint member further includes a pair of protrusions protruding from opposing ends of the support side in a second direction traversing the first direction to cover side surfaces of the display panel.

* * * * *